(12) United States Patent
Nagasaki

(10) Patent No.: US 8,750,744 B2
(45) Date of Patent: Jun. 10, 2014

(54) TECHNOLOGY FOR REDUCING CIRCUIT OSCILLATIONS AND RIPPLE IN A HIGH-VOLTAGE POWER SUPPLY USING A PIEZOELECTRIC TRANSFORMER

(71) Applicant: Canon Kabushiki Kaisha, Tokyo (JP)

(72) Inventor: Osamu Nagasaki, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/868,043

(22) Filed: Apr. 22, 2013

(65) Prior Publication Data

US 2013/0209133 A1 Aug. 15, 2013

Related U.S. Application Data

(63) Continuation of application No. 12/894,847, filed on Sep. 30, 2010, now Pat. No. 8,437,652.

(30) Foreign Application Priority Data

Oct. 27, 2009 (JP) ................................. 2009-247105
Sep. 22, 2010 (JP) ................................. 2010-212709

(51) Int. Cl.
*G03G 15/00* (2006.01)

(52) U.S. Cl.
USPC .......................................................... 399/88

(58) Field of Classification Search
USPC .................. 399/88, 89, 90; 310/318; 315/55; 363/16
See application file for complete search history.

(56) References Cited

U.S. PATENT DOCUMENTS

| 7,196,475 B2 | 3/2007 | Saito et al. |
| 7,265,479 B2 | 9/2007 | Yamaguchi et al. |
| 7,425,789 B2 | 9/2008 | Yasukawa et al. |
| 7,548,708 B2 | 6/2009 | Nagasaki et al. |
| 7,557,488 B2 | 7/2009 | Yamaguchi |
| 7,558,501 B2 | 7/2009 | Saito et al. |
| 8,437,652 B2 * | 5/2013 | Nagasaki .................. 399/88 |
| 2006/0220495 A1 | 10/2006 | Yamaguchi et al. |
| 2006/0273688 A1 | 12/2006 | Yasukawa et al. |
| 2007/0025753 A1 * | 2/2007 | Saito et al. .................. 399/88 |
| 2009/0045697 A1 | 2/2009 | Kondo |
| 2010/0290203 A1 | 11/2010 | Nagasaki |

FOREIGN PATENT DOCUMENTS

| JP | 11-206113 A | 7/1999 |
| JP | 2010-107608 A | 5/2010 |

* cited by examiner

*Primary Examiner* — Sandra Brase
(74) *Attorney, Agent, or Firm* — Fitzpatrick, Cella, Harper & Scinto

(57) ABSTRACT

A high-voltage power supply comprises the following components. A piezoelectric transformer outputs a voltage in accordance with a supplied drive frequency. A rectification part is connected to an output side of the piezoelectric transformer. A drive frequency generating part generates the drive frequency supplied to the piezoelectric transformer. A voltage detection part detects an output voltage of the piezoelectric transformer or the rectification part. A control part controls the drive frequency generating part such that a drive frequency corresponding to the output voltage detected by the voltage detecting part is generated. A first time constant, which is a time constant of the control part, is smaller than a second time constant, which is a time constant of a control target including the piezoelectric transformer and the rectification part. A third time constant, which is a time constant of the voltage detecting part, is smaller than the second time constant.

27 Claims, 8 Drawing Sheets

TECHNOLOGY FOR REDUCING CIRCUIT OSCILLATIONS AND RIPPLE IN A HIGH-VOLTAGE POWER SUPPLY USING A PIEZOELECTRIC TRANSFORMER

This application is a continuation of U.S. application Ser. No. 12/894,847, filed Sep. 30, 2010 (pending), the contents of which are incorporated herein by reference.

BACKGROUND OF THE INVENTION

1. Field of the Invention

The present invention relates to a high-voltage power supply using a piezoelectric transformer and to an image forming apparatus using such a high-voltage power supply.

2. Description of the Related Art

In electrophotographic image forming apparatuses, it is necessary to provide a high-voltage power supply that generates voltages in excess of several hundred volts (high voltages), for example to apply a DC bias voltage to a transfer member. Conventional high-voltage power supplies have used wire-wound electromagnetic transformers, but in recent years, high-voltage power supplies have used piezoelectric transformers (piezoelectric ceramic transformers) as well.

Japanese Patent Laid-Open No. 11-206113 discloses a high-voltage power supply including a voltage-controlled oscillator (VCO) generating a drive frequency that is input into a piezeoelectric transformer. The piezoelectric transformer has the feature that the output voltage becomes maximal at a resonance frequency. Therefore, the high-voltage power supply disclosed in Japanese Patent Laid-Open No. 11-206113 controls the output voltage of the piezoelectric transformer by controlling the frequency that is output from the VCO.

Ordinarily, the VCO changes the drive frequency of the piezoelectric transformer from a high frequency to a low frequency for example, in order to increase the output voltage of the piezoelectric transformer. Moreover, the VCO controls the duration of the rising edge of the output voltage by controlling the rate of change of the drive frequency. For this reason, the higher the desired voltage is, the longer the duration of the rising edge becomes. Furthermore, since the drive frequency is changed, output ripple tends to occur in the constant voltage output of the piezoelectric transformer and unnecessary circuit oscillations tend to be generated. For example, there is the risk that in an image forming apparatus using such a high-voltage power supply, the quality of the formed images is deteriorated due to the ripple in the output.

SUMMARY OF THE INVENTION

The present invention has the feature that it may reduce unnecessary circuit oscillations and ripple in the voltage that is output from the piezoelectric transformer.

The present invention provides a high-voltage power supply comprising the following components. A piezoelectric transformer outputs a voltage in accordance with a supplied drive frequency. A rectification part is connected to an output side of the piezoelectric transformer. A drive frequency generating part generates the drive frequency supplied to the piezoelectric transformer. A voltage detection part detects an output voltage of the piezoelectric transformer or the rectification part. A control part controls the drive frequency generating part such that a drive frequency corresponding to the output voltage detected by the voltage detecting part is generated. A first time constant, which is a time constant of the control part, is smaller than a second time constant, which is a time constant of a control target including the piezoelectric transformer and the rectification part. A third time constant, which is a time constant of the voltage detecting part, is smaller than the second time constant.

Further features of the present invention will become apparent from the following description of exemplary embodiments (with reference to the attached drawings).

DESCRIPTION OF THE EMBODIMENTS

EXAMPLE 1

Figure 1:
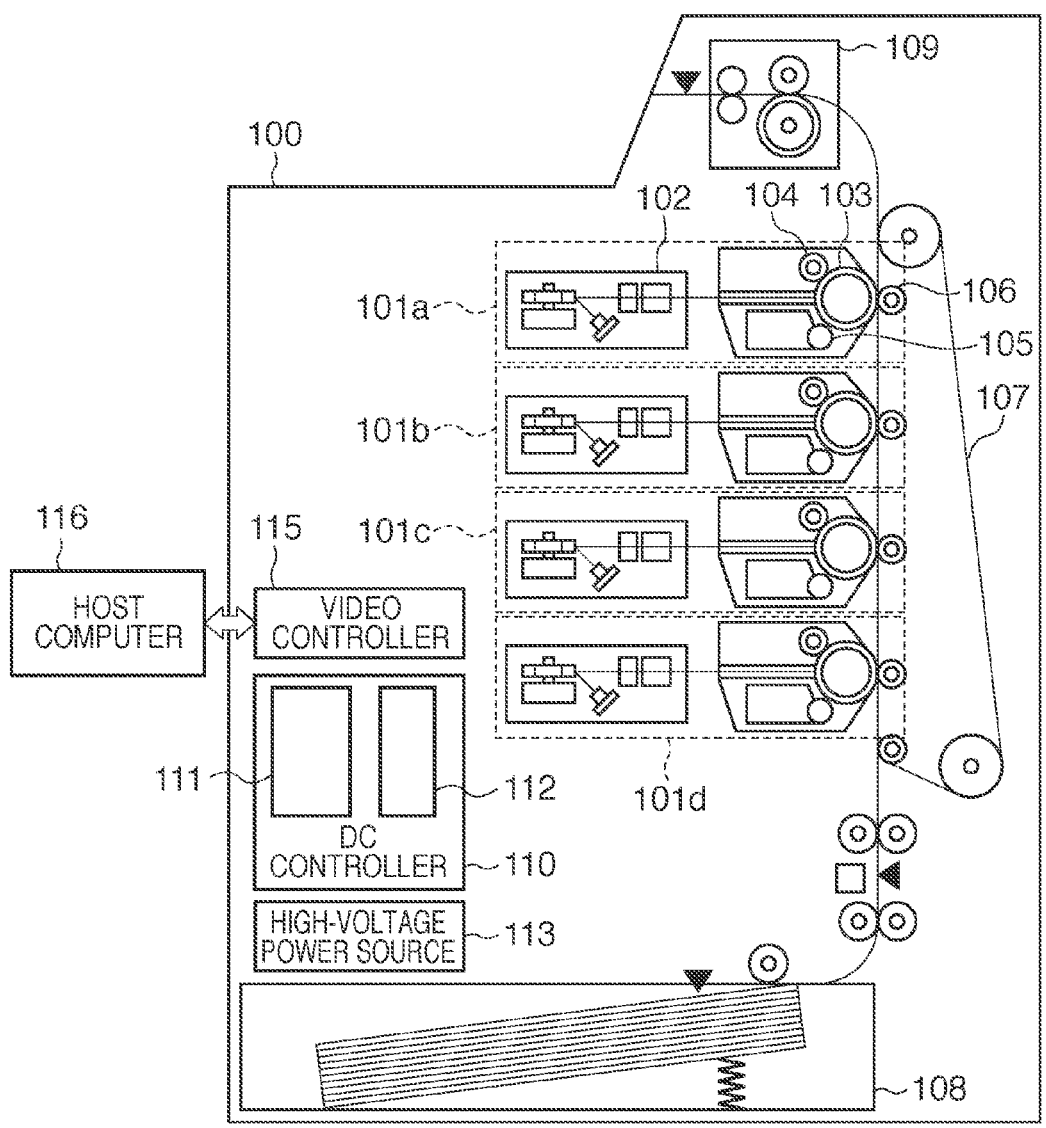
FIG. 1 is a diagram showing an example of an image forming apparatus.

First, an overall configuration of a printer 100 is explained with reference to FIG. 1. The printer 100 is an example of an electrophotographic image forming apparatus to which a power supply in accordance with the present invention can be applied. The power supply of the present invention does not depend on the image forming method. Therefore, the present invention can be applied not only to electrophotographic printers, but to image forming apparatuses employing any kind of image forming method, such as inkjet printers. The printer 100 includes image forming parts 101*a*, 101*b*, 101*c* and 101*d* functioning as the image forming units for yellow (Y), magenta (M), cyan (C) and black (B), respectively. The image forming parts 101*a* to 101*d* have basically the same configuration. It should be noted that the index letters a to d attached to the reference numerals are omitted when explaining aspects that are common to all image forming parts. A charge roller 104 uniformly charges a photosensitive drum 103. Thus, the surface (image forming surface) of the photosensitive drum 103, which serves as an image carrier, is charged uniformly by a charger. An electrostatic latent image is formed on the uniformly charged photosensitive drum 103 with exposure light from an exposure device 102 based on image signals of the image to be formed. A developing device 105 contains a developing agent of the toner color to be carried, and forms a developing material image by developing the electrostatic latent image formed on the photosensitive drum 103 with the developing agent. A transfer roller 106 that functions as a transfer part transfers the developing material image formed on the photosensitive drum 103 to a recording medium. More specifically, the transfer roller 106 and the photosensitive drum 103 nip and convey the recording medium that has been conveyed to them, and thus the developing material image formed on the photosensitive drum 103 is transferred to the recording medium. A transfer belt 107 is suspended by a driving roller and a driven roller, and the conveyance of the recording medium is controlled through the driving force of the driven roller. The recording medium is stacked in a recording medium cassette 108, and is supplied to the image forming part 101 in accordance with the print job. A fixing device 109 fixes the developing agent formed on the recording medium that is output from the image forming part 101a by applying pressure and heat to it.

The recording medium that is output from the fixing device 109 is ejected out of the printer 100.

A DC controller 110 includes a single-chip microcomputer (referred to as "CPU 111" below), an application-specific integrated circuit (referred to as "ASIC 112" below), various input/output control circuits (not shown in the drawings), and a memory such as a RAM and a ROM. The ASIC 112 adjusts the drive frequency that is supplied to a high-voltage power supply 113, and thus functions as a control unit that controls the output voltage that is output from the high-voltage power supply 113. A video controller 115 develops image data that is input from an external device 116, such as a personal computer, into bitmap data, and converts the bitmap data into an image signal for forming an image. The video controller 115 also converts the image data read in from a scanner of the printer 100 into image signals for forming images.

The high-voltage power supply 113 generates and outputs a high voltage for charging that is applied to the charge roller 104, a high voltage for developing (referred to below as "high developing voltage") that is applied to the developing agent, and a high voltage for transfer (referred to below as "high transfer voltage") that is applied to the transfer rollers 106 of the image forming parts 101. Furthermore, the high-voltage power supply 113 includes a piezoelectric transformer. The piezoelectric transformer is made of a ceramic as a base material, and is capable of generating a high voltage with greater efficiency than an electromagnetic transformer. Moreover, in the piezoelectric transformer, the distance between the primary-side and secondary-side electrodes can be made large. Also, in piezoelectric transformers, it is not particularly necessary to apply a molding process for isolation. Thus, piezoelectric transformers are effective in reducing the size and the weight of high-voltage power supplies.

Figure 2:
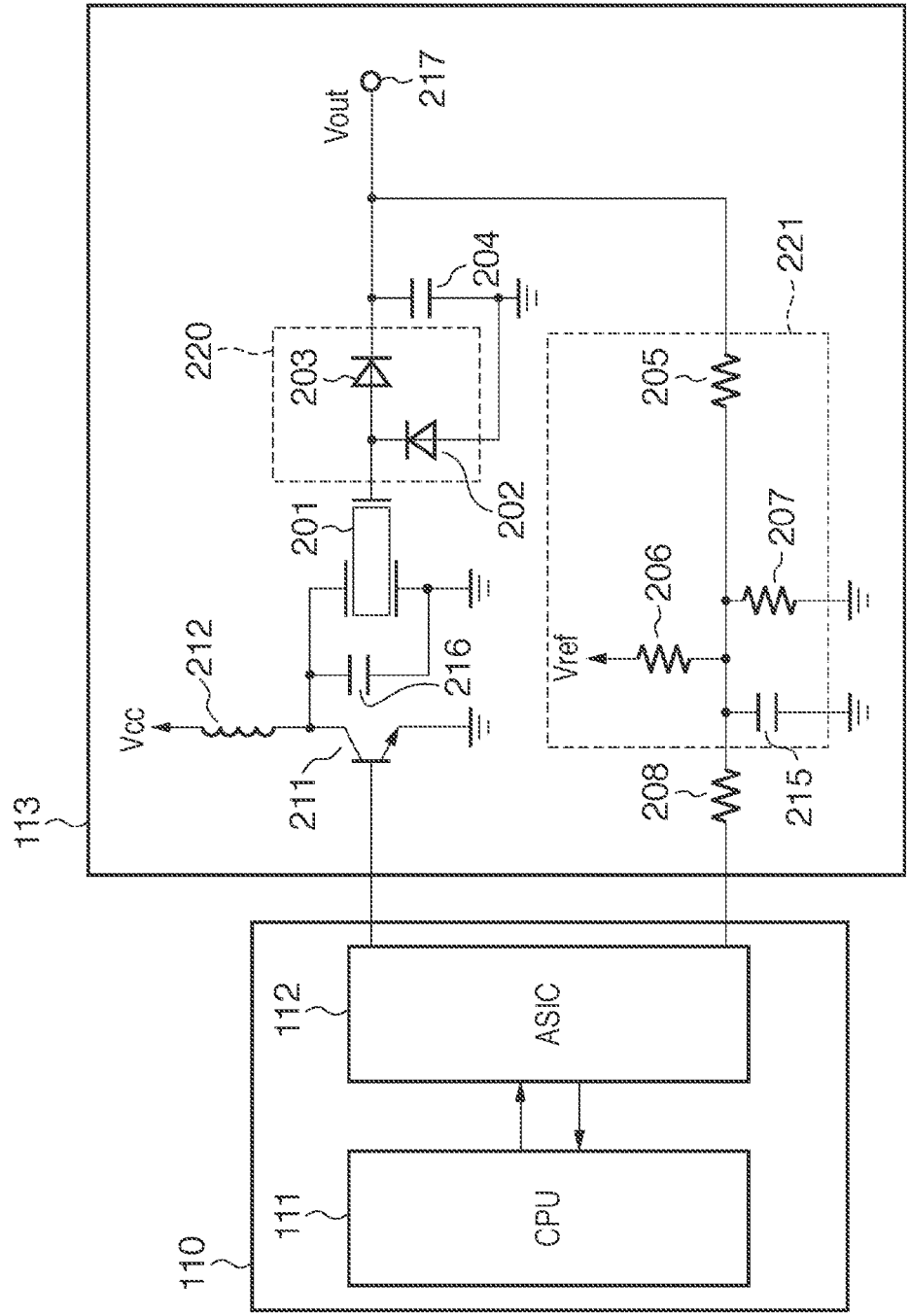
FIG. 2 is a circuit diagram of a high-voltage power supply 113 according to Example 1.

In FIG. 2, the piezoelectric transformer 201 of the high-voltage power supply 113 outputs a voltage in accordance with the supplied drive frequency. In general, in high-voltage power supplies, the output voltage of the piezoelectric transformer 201 is controlled by the oscillation frequency from an analog circuit that includes a voltage-controlled oscillator (VCO) connected to the piezoelectric transformer 201. That is to say, the VCO controls the duration of the rising edge of the output voltage by controlling the change rate of the drive frequency. Therefore, the higher the desired voltage becomes, the longer is the duration of the rising edge. In Example 1, on the other hand, the ASIC 112 generates a drive frequency and applies it to the piezoelectric transformer 201. Thus, by using a digital circuit to constitute the drive frequency generating part and the control part, the duration of the rising edge of the output voltage can be shortened.

The ASIC 112 is connected to the high-voltage power supply 113 by a feedback control system, so that it detects the voltage that is output from the piezoelectric transformer 201. The ASIC 112 obtains the value of a voltage that is output from the CPU 111, and supplies a drive frequency corresponding to the obtained voltage value to the piezoelectric transformer 201. The drive frequency (pulse signal) that is output from the ASIC 112 is input into a base terminal of a transistor 211. The collector terminal of the transistor 211 is connected to a positive power supply voltage Vcc via an inductor 212. The emitter terminal of the transistor 211 is connected to ground. The collector terminal of the transistor 211 is connected to one side of a capacitor 216 as well as to a first terminal of a piezoelectric transformer 201. The other side of the capacitor 216 is connected to ground, together with a second terminal of the piezoelectric transformer 201. The transistor 211 is switched in accordance with the drive frequency (pulse signal) supplied from the ASIC 112, and the input voltage is raised due to resonance between the inductor 212 and the capacitor 216, so that a high voltage is generated. This high voltage is supplied as a pulse signal to the primary side of the piezoelectric transformer 201. The piezoelectric transformer 201 oscillates in accordance with the pulse signal supplied to the primary side, and on the secondary side, an AC voltage is generated that is amplified at a voltage increase ratio depending on the size of the piezoelectric transformer 201.

A rectification part is connected to the secondary side of the piezoelectric transformer 201. That is to say, the output terminal of the piezoelectric transformer 201 is connected to the cathode terminal of a rectifying diode 202 and the anode terminal of a rectifying diode 203. One side of a smoothing capacitor 204 is connected to the cathode terminal of the diode 203, whereas the other side of the smoothing capacitor 204 is connected to ground as well as to the anode terminal of the diode 202. The diodes 202 and 203 form a rectifying circuit 220. Thus, an AC voltage that is output from the output terminal of the piezoelectric transformer 201 is rectified and smoothened into a positive voltage by this rectifying circuit 220 and the capacitor 204, and is supplied through the output terminal 217 to the transfer roller 106. Also the capacitor 204 may be considered to be part of the rectifying circuit 220.

A voltage detecting part is provided to detect the output voltage of the piezoelectric transformer 201 or the rectification part. The configuration of the voltage detecting part is as follows: An output terminal 217 is connected to one side of a resistor 205. The other side of the resistor 205 is connected to one side of a resistor 207, one side of a resistor 206, one side of a capacitor 215 and to one side of a protective resistor 208. The other side of the resistor 206 is connected to a reference voltage source, which supplies a reference voltage. The other side of the resistor 207 and the other side of the capacitor 215 are connected to ground. The other side of the resistor 208 is connected to an input terminal of the ASIC 112. That is to say, the output voltage from the rectifying circuit 220 is divided by the resistors 205, 206 and 207, and this divided voltage is input into the ASIC 112 via the resistor 208. Thus, the resistors 205, 206 and 207 form a voltage detection circuit 221. It should be noted that also the capacitor 215 and the resistor 208 can be considered to be a part of the voltage detection circuit 221. Here, explanations were given for a high transfer voltage, but also the two other high-voltage power supplies (not shown in the drawings) may employ a similar configuration to generate a high charge voltage and a high developing voltage.

Figure 3:
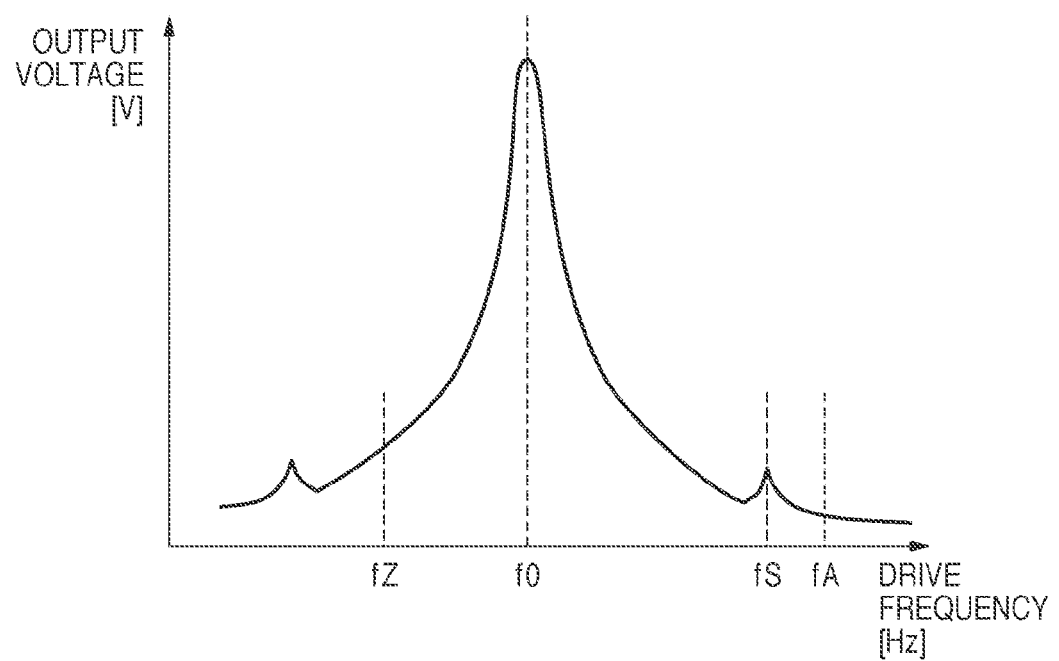
FIG. 3 is a diagram illustrating the relation between the drive frequency and the output voltage of a piezoelectric transformer 201.

In FIG. 3, the horizontal axis denotes the drive frequency [Hz] that is into the piezoelectric transformer 201, and the vertical axis denotes the voltage [V] that is output from the piezoelectric transformer 201. Generally, the characteristics of the piezoelectric transformer 201 are such that the output voltage spreads out toward the bottom while becoming maximal at the resonance frequency f0, as shown in FIG. 3. fZ denotes the minimal frequency at which operation is possible with a VCO, and fA denotes the maximum frequency at which operation is possible with a VCO. Ordinarily, the output voltage of the piezoelectric transformer is controlled by sweeping the driving pulses between the maximum frequency fA and the resonance frequency f0. According to the output of the piezoelectric transformer 201, there is a plurality of unnecessary resonance frequencies fS other than the resonance frequency f0, which are also called spurious frequencies. In a high-voltage power supply using a VCO instead of the ASIC 112, the time for which the drive frequency is controlled in order to obtain the desired voltage from the piezoelectric transformer 201 becomes long. More specifically, the VCO first inputs the maximum frequency fA into the piezoelectric transformer 201. After this, the VCO reduces the drive frequency by a constant change rate until the desired voltage is output from the piezoelectric transformer 201. Consequently, the higher the desired voltage is, the more time the high-voltage power supply needs to control the drive frequency that is input into the piezoelectric transformer 201. Furthermore, if the range of desired voltages needs to be broad, then the voltages tend to be influenced by the spurious frequencies fS, and the control at low voltages becomes difficult.

To address these issues, in Example 1, a digital circuit such as the CPU 111 or the ASIC 112, which controls the piezoelectric transformer 201, is provided instead of the VCO. The piezoelectric transformer 201 is directly controlled by switching the transistor 211 with the clock or pulse signal that is output from this digital circuit. Furthermore, the CPU 111 and the ASIC 112 set a drive frequency that corresponds to the desired voltage value by using a table with a predefined relationship between driving frequencies and output voltages. Thus, by immediately generating a drive frequency for obtaining the desired voltage and inputting it into the piezoelectric transformer 201, the control of the drive frequency that was conventionally required can be omitted. That is to say, with Example 1, the time of the rising edge to the target voltage can be shortened considerably compared to the prior art that used a VCO.

Figure 4:
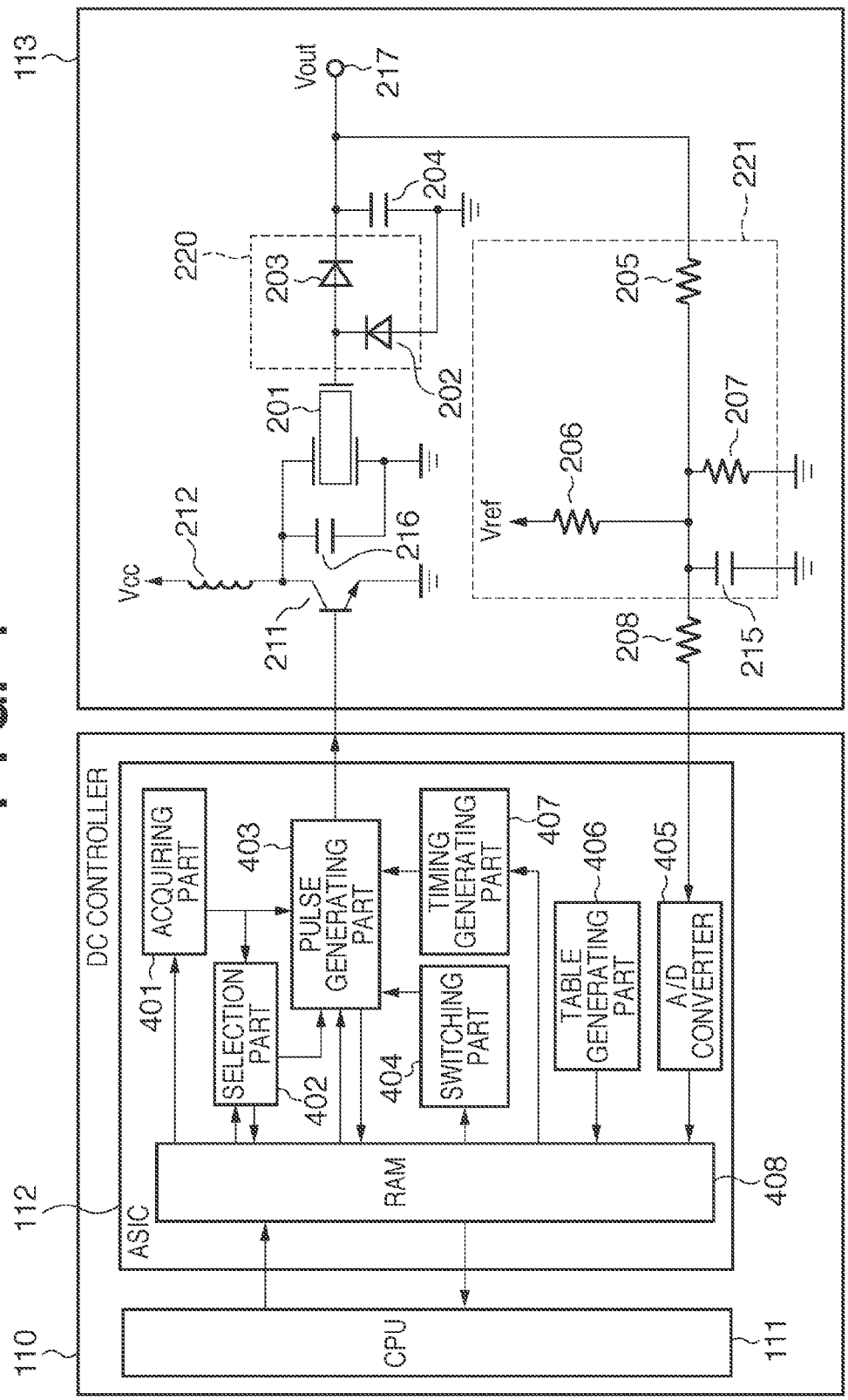
FIG. 4 is a block diagram illustrating a configuration example of an ASIC 112 according to Example 1.

An acquiring part 401 of the ASIC 112, which is shown in FIG. 4, functions as an acquiring unit that acquires a target voltage value to be output from the piezoelectric transformer 201. More specifically, the acquiring part 401 acquires the target value (referred to in the following as "target voltage value") notified from the CPU 111. Using a look-up table (referred to in the following as "LUT") in which for example the relation between a plurality of driving frequencies and a plurality of output voltages is predefined, a selection part 402 functions as a setting unit that sets the drive frequency corresponding to the target voltage value. More specifically, the selection part 402 functions as a selection unit that selects the drive frequency corresponding to the target voltage value from the LUT. Moreover, the selection part 402 sets the selected drive frequency in the pulse generating part 403. Here, the LUT is generated by a table generating part 406 through initialization at the time of power-up of the printer 100, and is stored in the RAM 408. The pulse generating part 403 functions as a pulse generation unit or a drive frequency generating part that generates the pulse signal to be supplied to the piezoelectric transformer 201 in accordance with the selected drive frequency. Thus, the CPU 111 and the ASIC 112 function as a control part that controls the drive frequency generating part such that a drive frequency is generated in accordance with the voltage value of the output voltage that is detected by the voltage detecting part.

The switching part 404 functions as a switching unit that switches the drive frequency by a predetermined change rate. In accordance with a timing that is notified from a timing generating part 407, the pulse generating part 403 generates pulses by adding the change rate notified by the switching part 404 to the present frequency. The timing generating part 407 notifies the timing signal to the pulse generating part 403 in accordance with the timing data that is stored in the RAM 408. An A/D converter 405 functions as a detection unit that detects the output voltage generated by the piezoelectric transformer 201 based on the drive frequency switched with the switching part 404. More specifically, the A/D converter 405 converts the input analog signal into a digital signal.

Figure 5:
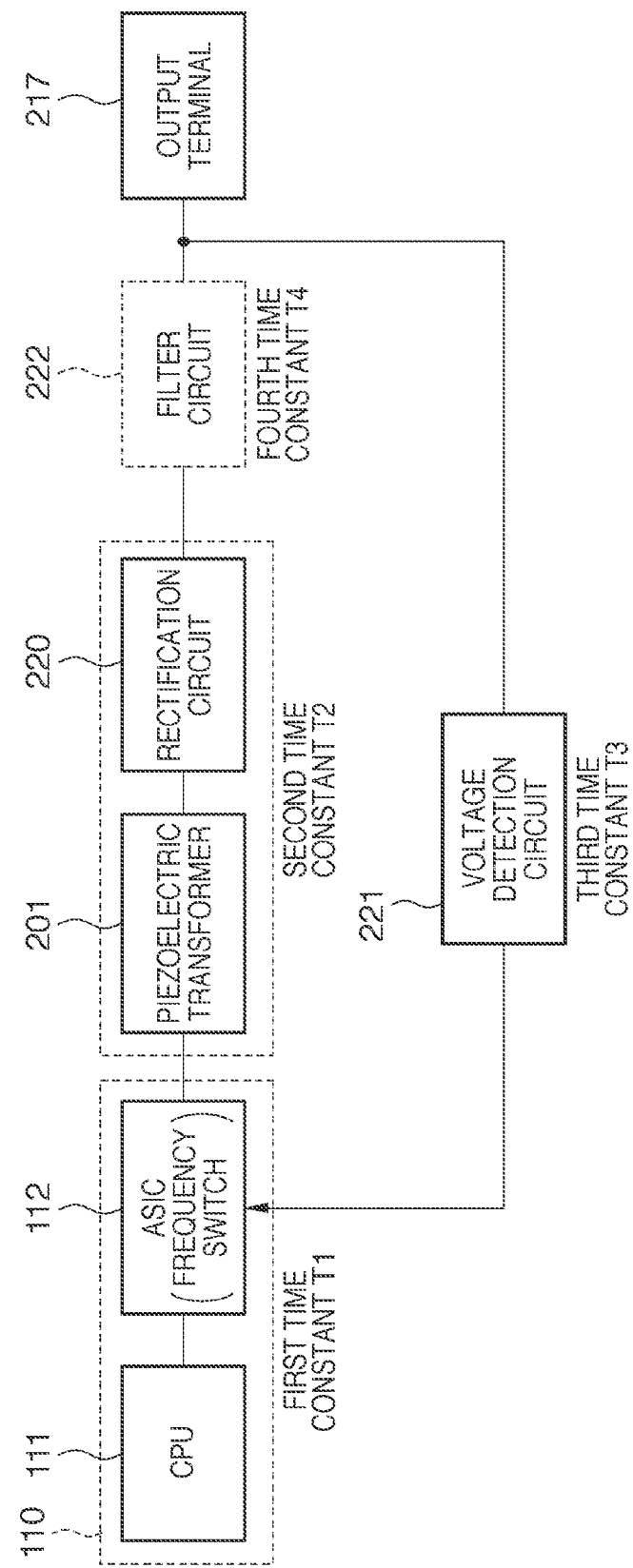
FIG. 5 is a block diagram showing a feedback control system according to Example 1.

In FIG. 5, the time constant of the control part included in the CPU 111 and the ASIC 112 is taken to be a first time constant T1 (this is mainly the circuit time constant of the switching part 404). The time constant of the control target, which includes the piezoelectric transformer and the rectification part, is taken to be a second time constant T2. The time constant of the voltage detection circuit 221 is taken to be a third time constant T3. It should be noted that in FIG. 5, a filter circuit 222 may be connected optionally on the side of the output terminal where the voltage is output by the rectifying circuit 220. The filter circuit 222 is a circuit for reducing ripple, but it is not an essential element of Example 1. The filter circuit 222 is designed such that it has a fourth time constant T4.

Figure 6A:
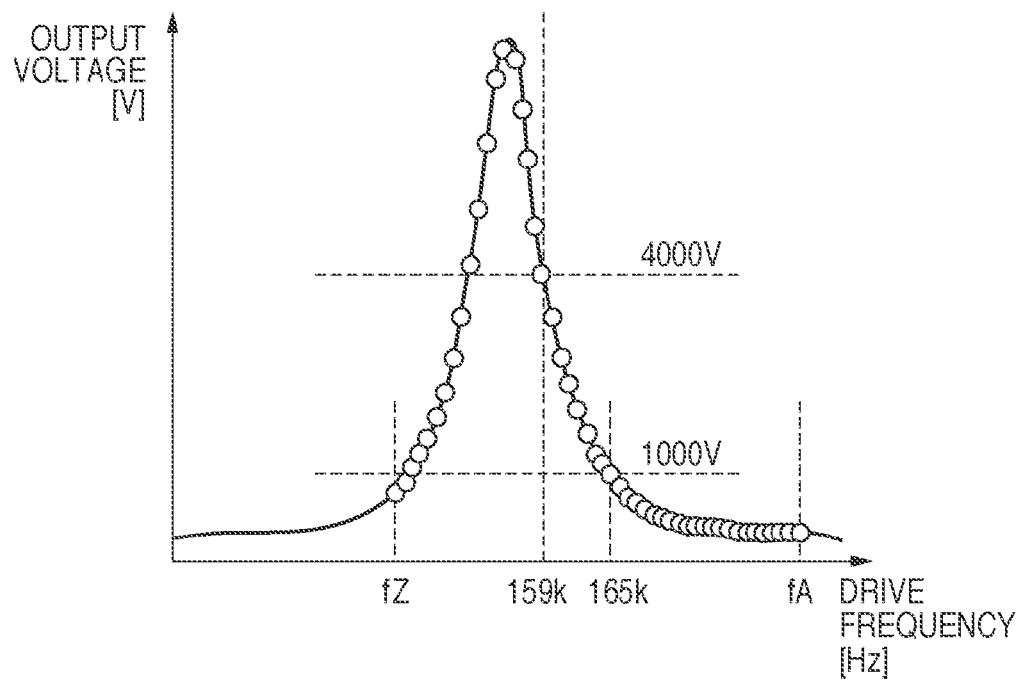
FIG. 6A is a diagram showing the characteristics of the output voltage with respect to the drive frequency of the piezoelectric transformer 201 according to Example 1.

As can be seen in FIG. 6A, the shape of the output voltage is such that it spreads out towards the bottom, while becoming maximal at the resonance frequency f0. fZ indicates the lowest frequency that can be generated with the ASIC 112, and fA indicates the highest frequency that can be generated with the ASIC 112. Moreover, the circles (O) shown in FIG. 6A indicate the driving frequencies between which the switching part 404 switches. The number of circles (sampling number) shown in FIG. 6A is merely an example, and the switching part 404 can control the sampling number by controlling the change rate. Furthermore, the control of the sampling number (sampling resolution) is determined in dependence of the system clocks of the CPU 111 and the ASIC 112. For example, if the system clocks of the CPU 111 and the ASIC 112 are 50 MHz, then the resolution becomes a period of 0.02 μsec. In the frequency characteristics shown in FIG. 6A, the following approximation is used to calculate the relation between the control frequency and the output voltage in the actual range of use: The curve of the output voltage of a frequency between 159 kHz and 165 kHz (corresponds to an output voltage of 4000 V to 1000 V) is linearly approximated. As a result, the voltage variation per unit frequency becomes 500 V/kHz, that is, 0.5 V/Hz.

Figure 6B:
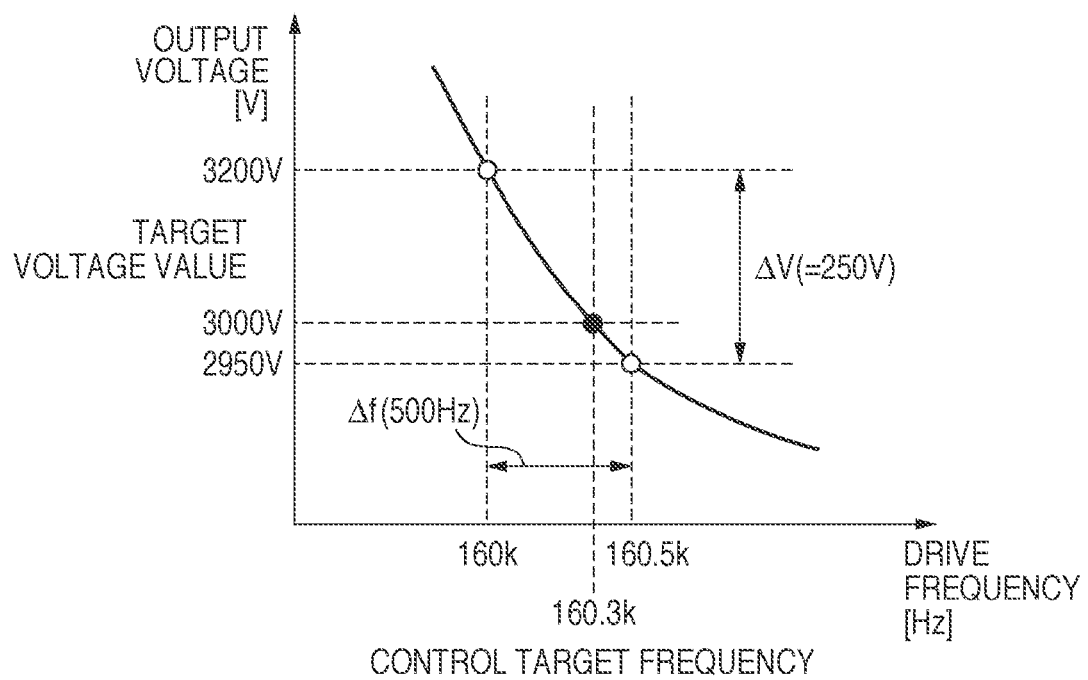
FIG. 6B is a diagram showing, in magnification, the characteristics of the drive frequency and the output voltage when the target voltage is set to 3000 V.

In FIG. 6B, the target voltage value 3000 V is between 3200 V, which corresponds to 160 kHz, and 2950 V, which corresponds to 160.5 kHz. In order to output a target voltage value of 3000 V, the piezoelectric transformer has to be driven at a corresponding drive frequency of ft=160.3 kHz. However, as shown in FIG. 6A and FIG. 6B, only discrete drive frequencies can be attained. Accordingly, to obtain a target voltage value of 3000 V, for example the following method can be employed.

Figure 7A:
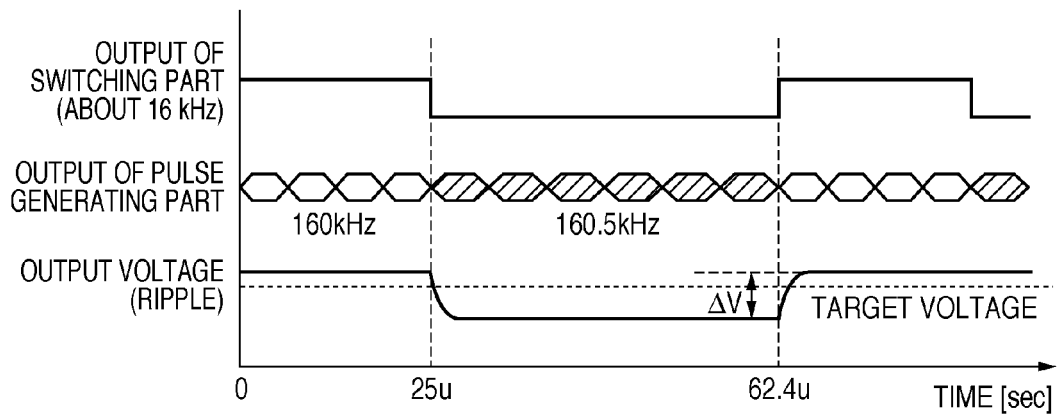
FIG. 7A is a diagram showing the output of the switching part, the output of the pulse generating part and the output voltage.

The drive frequency generating part is configured such that the target drive frequency ft is generated by outputting pulses P1 of a first frequency f1 and pulses P2 of a first frequency f2 with a designated switching cycle ($1/f_x$), while switching with the control part between them. As shown in FIG. 7A, the two adjacent frequencies 160 kHz (corresponding to a period of 6.25 μsec) and 160.5 kHz (corresponding to a period of 6.23 μsec) are output in an alternating manner from the pulse generating part 403, in accordance with the switching with the switching part 404. Then, the target voltage value of 3000 V can be produced combining 10 waves of these (here, 4 waves of 160 kHz and 6 waves of 160.5 kHz). At this time, the switching frequency fx of the frequencies 160 kHz and 160.5 kHz becomes 1/10 of the frequency 160 kHz, that is, about 16 kHz. The reason for taking 1/10 is because the target voltage value is generated by 10 waves (10 pulses). That is to say, if a total of n pulses of the two neighboring frequencies f1 and f2 are used, then the switching frequency $f_x$ can be expressed as $f_x$=f1/n. A period of 62.5 nsec, which corresponds to about 16 kHz, is taken as the first time constant T1. That is to say:

$$T1=1/f_x=n/f1$$

Thus, the first time constant T1 matches the switching cycle (1/$f_x$).

Here, an example was explained in which the target voltage value is generated by combining the two frequencies with a total of 10 waves. However, the number of combined pulses may also be 50 or 100. However, the larger the number of combined pulses becomes, the larger the first time constant T1 will be. Therefore, in accordance with the change of the first time constant T1, which depends on the number of combined pulses, it is also possible to change the other time constants as appropriate. Furthermore, it is also possible to repeatedly output one or a plurality of pulses P1 and P2 of the two frequencies f1 and f2 in alternation, for example like this: P2, P1, P2, P1, P2, P2, P1, P2, P1, P2 (P1:P2=4:6).

As shown in FIG. 6B and FIG. 7A, the frequency difference Δf between the two driving frequencies 160 kHz and 160.5 kHz is 500 Hz. An output voltage difference ΔV corresponding to this frequency difference Δf is calculated from the above-noted relation of the voltage variation per unit frequency.

0.5 (V/Hz)×500 (Hz)=250 (V)

That is to say, output ripple of an output voltage difference ΔV=250 V is generated for a frequency difference of Δf=500 Hz. As shown in the voltage waveform when outputting a constant voltage in FIG. 7B, the frequency of the output ripple is about 16 kHz. That is to say, the first time constant T1 matches the inverse (switching cycle) of the switching frequency ($f_x$=16 kHz), so that it also matches the inverse of the frequency fr of the output ripple to be lowered. In order to sufficiently attenuate the output ripple (of 250 V amplitude), the second time constant T2 of the control target including the piezoelectric transformer 201 and the rectifying circuit 220 may be adjusted.

Figure 8:
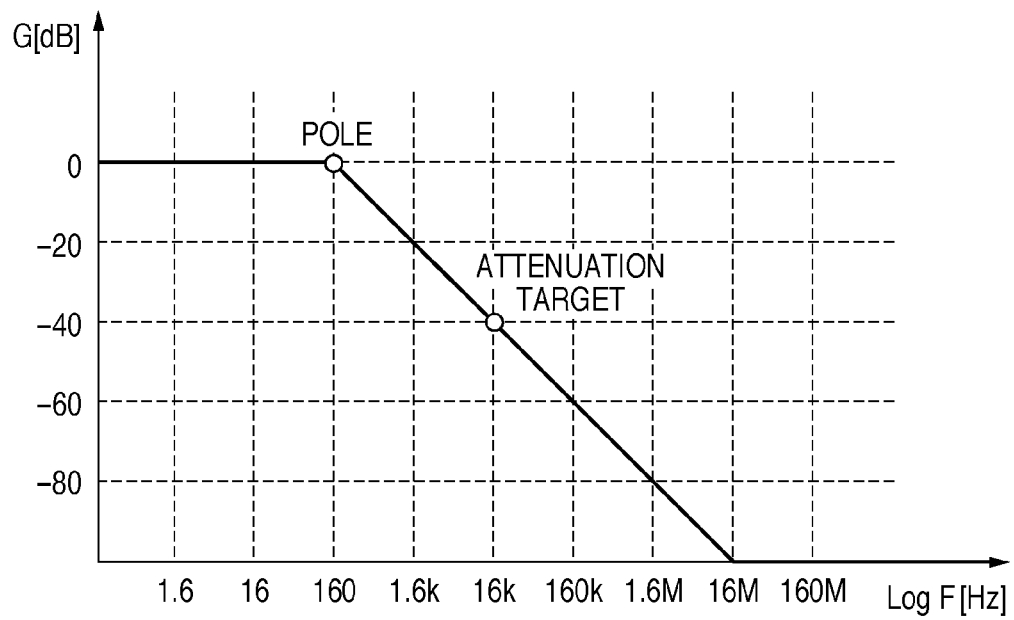
FIG. 8 is a diagram showing the desired frequency characteristics for a second time constant T2.

Let us assume that output ripple with an amplitude of 250 V is to be attenuated to 2.5 V (target attenuation ratio d=1/100). As shown in FIG. 8, the frequency characteristics of the second time constant T2 have a pole at 160 Hz (6.25 msec) and can be realized by frequency characteristics having a gain of −40 dB at the attenuation target 16 kHz. That is to say, the second time constant T2 of the control target including the piezoelectric transformer 201 and the rectifying circuit 220 (corresponding to the time tr of the rising edge of the output voltage) should be designed such that it is at least 6.25 msec (160 Hz). That is to say, the second time constant T2 becomes greater than the time tr of the rising edge of the output voltage. In case that a larger amount of attenuation is to be obtained, the time tr of the rising edge of the output voltage should be made larger than 6.25 msec. The design needs to consider the influence that the delay of the rising edge of the output voltage has on the image. That is to say, there is a tradeoff between image quality issues caused by output ripple and image quality issues caused by the delay of the rising edge of the output voltage, so that an optimization may be achieved based on experimental and simulation results.

Figure 9:
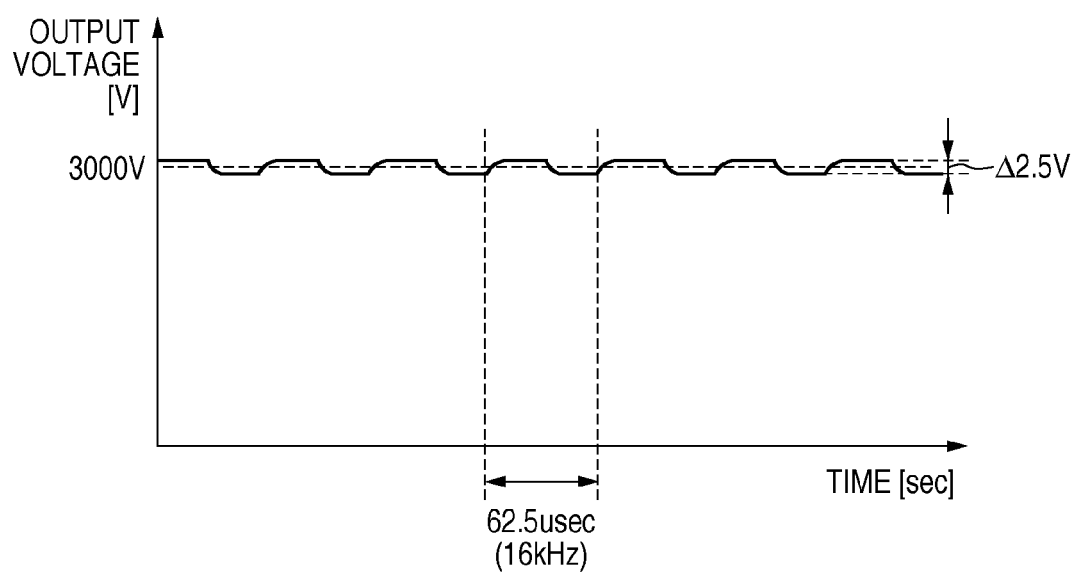
FIG. 9 is a diagram showing the output waveform when the output ripple is attenuated to 2.5 V.

FIG. 9 is a diagram showing an output waveform for when the output ripple is attenuated to 2.5 V. The third time constant T3, which is that of the voltage detection circuit 221, should be set to a value at which circuit oscillations can be avoided. The third time constant T3 should be set larger than the period pt corresponding to the drive frequency ft of the piezoelectric transformer 201 but smaller than the second time constant T2 of the control target including the piezoelectric transformer and the rectifying circuit 220. The relations of the time constants of the various circuits as explained above can be summarized as follows. The period pt is for example 160 kHz (=6.25 μsec).

first time constant T1=62.5 μsec
second time constant T2≥6.25 μsec
third time constant T3>6.25 μsec, T3<6.25 μsec
That is to say, the following relations are established:

$$T1<T2 \text{ and } T3<T2$$

Thus, by configuring the piezoelectric transformer, the rectification part and the voltage detecting part such that the third time constant T3, which is the time constant of the voltage detecting part, becomes smaller than the second time constant T2, which is the time constant of the control target including the piezoelectric transformer and the rectification part, it is possible to reduce unnecessary circuit oscillations. Furthermore, by configuring control part, the piezoelectric transformer, and the rectification part such that the first time constant T1, which is the time constant of the control part, becomes smaller than the second time constant T2, it is possible to reduce ripple. If ripple is reduced, the quality of the images formed with the printer 100 can be improved. By configuring the drive frequency generating part and the control part with a digital circuit, it is possible to reduce the time of the rising edge of the output voltage compared to that of an analog circuit including a VCO.

In the present example, the drive frequency of the piezoelectric transformer was set to 160 kHz, the target voltage value was set to 3000 V, and the system clocks of the CPU 111 and the ASIC 112 were set to 50 MHz, to make the example easy to follow. However, the present invention is not limited to these values, and it can also be applied to various output voltages and driving frequencies corresponding to these output voltages. Furthermore, in the present example, a configuration was employed, in which the output voltage is increased by changing the drive frequency of the piezoelectric transformer from the high side (high frequencies) to the low side (low frequencies). However, it is also possible to employ a configuration in which the output voltage is increased by changing the drive frequency conversely from the low side to the high side. Moreover, in the present example, the image forming apparatus was explained to be a color laser printer. However, the image forming apparatus is not limited to color laser printers, and it may also be a monochrome laser printer, a copier or a fax machine. Furthermore, the high transfer voltage used in a color image forming apparatus was explained as an example, but the present invention can also be applied to other high-voltage biasing, such as for charging or developing.

EXAMPLE 2

In Example 2, a filter part is provided that is connected to the voltage output side of the rectification part and reduces ripple included in the output voltage that is output from a rectification part. That is to say, as shown as an option in FIG. 5, a filter circuit 222 is provided between the control target and the output terminal 217. A fourth time constant T4, which is the time constant of the filter circuit 222 is adjusted such that the output voltage ripple (250V) in the first time constant T1 (switching frequency of 16 kHz) can be sufficiently attenuated. More specifically, the control part and the filter part may be designed such that the first time constant T1 becomes smaller than the fourth time constant T4.

Figure 7B:
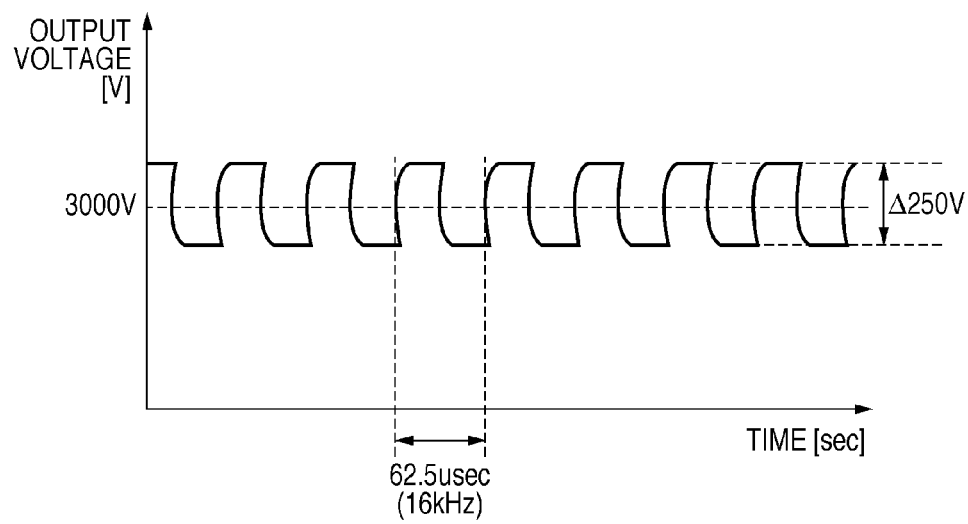
FIG. 7B is a diagram showing a voltage waveform at the time of constant voltage output.

The following considers the case that the output ripple is to be attenuated to for example $\frac{1}{100}$, as explained with reference to FIG. 7B. In this case, the frequency characteristics of the fourth time constant T4 of the control target should be such that they have a pole at 160 Hz (6.25 msec) and the gain at the attenuation target of 16 kHz is −40 dB, as shown in FIG. 8.

In order to avoid circuit oscillations, the third time constant T3 of the voltage detection circuit 221 should be larger than the drive frequency of the piezoelectric transformer (for example 160 kHz (=6.25 μsec), and smaller than the second time constant T2.

The relations of the time constants of the various circuits as explained above can be summarized as follows.
first time constant T1=62.5 μsec
second time constant T2>T3
third time constant T3>6.25 μsec
fourth time constant T4≥6.25 μsec
That is to say, the following relations are established:

T1<T4 and T3<T2

For example, let us assume that the filter circuit 222 is realized as a simple RC circuit. In this case, if the resistance of the resistor is set to 2 MΩ and the capacitance of the capacitor is set to 3300 pF, and the pole is set to at least 160 Hz, a desired low-pass filter can be obtained. It should be noted that in Example 2, there is no limitation to setting the second time constant T2 (that is, the time of the rising edge of the output voltage) to at least 160 Hz. Thus, in Example 2, the design freedom for the circuit time constants is greater than in Example 1.

Thus, the same effects as in Example 1 can be displayed by providing a filter part in Example 2. It should be noted that it is not necessary to make the first time constant T1 smaller than the second time constant T2, since a filter part is provided. Thus, in Example 2, the design freedom of the circuit time constants is greater than in Example 1. However, it is also possible to combine Example 1 and Example 2. That is to say, it is also possible to introduce a filter circuit 222, and to let T1<T4 and T1<T2 be satisfied.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-247105 filed Oct. 27, 2009 and No. 2010-212709 filed Sep. 22, 2010, which are hereby incorporated by reference herein in their entirety.

What is claimed is:

1. A high-voltage power supply comprising:
a piezoelectric transformer that outputs a voltage in accordance with a drive signal;
an output part that is connected to an output side of the piezoelectric transformer;
a drive signal generating part that generates the drive signal supplied to the piezoelectric transformer; and
a control part that controls a frequency of the drive signal so as to control the voltage from the output part,
wherein a first time constant, which is a time constant of the control part, is smaller than a second time constant, which is a time constant of a control target including the piezoelectric transformer and the output part.

2. The high-voltage power supply according to claim 1, wherein the output part includes a rectifier part and a smoothing part, and a voltage rectified by the rectifier part and smoothed by the smoothing part is output to a load.

3. The high-voltage power supply according to claim 1, wherein the control part changes the frequency of the drive signal to a different frequency more than once, and the first time constant corresponds to a period of changing the frequency.

4. The high-voltage power supply according to claim 1, wherein the second time constant corresponds to a rising time of the voltage of the output part.

5. The high-voltage power supply according to claim 1, wherein the control part is a digital circuit.

6. The high-voltage power supply according to claim 5, further comprising a detection part that detects the voltage from the output part,
wherein the control part converts an analog signal from the detection unit into a digital signal, takes in the digital signal, and controls the frequency of the drive signal according to a value corresponding to the taken digital signal and a target voltage.

7. The high-voltage power supply according to claim 1, wherein the control part is further configured to convert an output from the output part into a digital data, and process the digital data, and controls the drive signal based on a process result of the digital data.

8. A high-voltage power supply comprising:
a piezoelectric transformer that outputs a voltage in accordance with a drive signal;
an output part that is connected to an output side of the piezoelectric transformer;
a filter part that is connected to an output side of the output part;
a drive signal generating part that generates the drive signal supplied to the piezoelectric transformer; and
a control part that controls frequency of the drive signal so as to control a voltage from the output part,
wherein a first time constant, which is a time constant of the control part, is smaller than a second time constant, which is a time constant of the filter part.

9. The high-voltage power supply according to claim 8, wherein the output part includes a rectifier part and a smoothing part, and a voltage rectified by the rectifier part and smoothed by the smoothing part is output to a load.

10. The high-voltage power supply according to claim 8, wherein the control part changes the frequency of the drive signal to a different frequency more than once, and the first time constant corresponds to a period of changing the frequency.

11. The high-voltage power supply according to claim 8, wherein the control part is a digital circuit.

12. The high-voltage power supply according to claim 8, further comprising a detection part that detects the voltage from the output part,
wherein the control part converts an analog signal from the detection unit into a digital signal, takes in the digital signal, and controls the frequency of the drive signal according to a value corresponding to the taken digital signal and a target voltage.

13. The high-voltage power supply according to claim 8, wherein the control part is further configured to convert an output from the output part into a digital data, and process the digital data, and controls the drive signal based on a process result of the digital data.

14. An image forming apparatus comprising:
an image forming part that forms an image; and
a high-voltage power supply that supplies a voltage to the image forming part;
wherein the power supply includes:
  a piezoelectric transformer that outputs a voltage in accordance with a drive signal;
  an output part that is connected to an output side of the piezoelectric transformer;
  a drive signal generating part that generates the drive signal supplied to the piezoelectric transformer; and
  a control part that controls a frequency of the drive signal so as to control a voltage from the output part,
  wherein a first time constant, which is a time constant of the control part, is smaller than a second time constant, which is a time constant of a control target including the piezoelectric transformer and the output part.

15. The image forming apparatus according to claim 14, wherein the image forming part includes at least one of:
an electric charger that charges an image carrier;
a developer that develops an electrostatic latent image formed on the image carrier into a developed image; and
a transfer part that transfers the developed image formed on the image carrier.

16. The image forming apparatus according to claim 14, wherein the control part is further configured to convert an output from the output part into a digital data, and process the digital data, and controls the drive signal based on a process result of the digital data.

17. An image forming apparatus comprising:
an image forming part that forms an image; and
a high-voltage power supply that supplies a voltage to the image forming part,
wherein the p owner supply includes:
  a piezoelectric transformer that outputs a voltage in accordance with a drive signal;
  an output part that is connected to an output side of the piezoelectric transformer;
  a filter part that is connected to an output side of the output part;
  a drive signal generating part that generates the drive signal supplied to the piezoelectric transformer; and
  a control part that controls frequency of the drive signal so as to control a voltage from the output part,
  wherein a first time constant, which is a time constant of the control part, is smaller than a second time constant, which is a time constant of the filter part.

18. The image forming apparatus according to claim 17, wherein the image forming part includes at least one of:
an electric charger that charges an image carrier;
a developer that develops an electrostatic latent image formed on the image carrier into a developed image; and
a transfer part that transfers the developed image formed on the image carrier.

19. The image forming apparatus according to claim 17, wherein the control part is further configured to convert an output from the output part into a digital data, and process the digital data, and controls the drive signal based on a process result of the digital data.

20. A high-voltage power supply comp rising:
a voltage output part including a piezoelectric transformer; and
a control part that controls a frequency of a drive signal to drive the piezoelectric transformer,
wherein a first time constant of the control part is smaller than a second time constant of the voltage output part.

21. The high-voltage power supply according to claim 20, further comprising
a detection part that detects an output of the voltage output part and transmits a detection result to the control part, wherein a third constant of the detection part is smaller than the second time constant of the voltage output part.

22. The high-voltage power supply according to claim 21, wherein the third time constant is larger than a cycle corresponding to a driving frequency of the piezoelectric transformer.

23. The high-voltage power supply according to claim 20, wherein the first time constant corresponds to a switching cycle of frequency of the drive signal, and the second time constant is larger than a rising time of the output from the voltage output part.

24. An image forming apparatus comprising:
an image forming part that forms an image; and
a high-voltage power supply that supplies a voltage to the image forming part;
wherein the p owner supply includes:
a voltage output part including a piezoelectric transformer;
a control part that controls a frequency of a drive signal to drive the piezoelectric transformer,
wherein a first time constant of the control part is smaller than a second time constant of the voltage output part.

25. The image forming apparatus according to claim 24, further comprising
a detection part that detects an output of the voltage output part and transmits a detection result to the control part, wherein a third constant of the detection part is smaller than the second time constant of the voltage output part.

26. The image forming apparatus according to claim 25, wherein the third time constant is larger than a cycle corresponding to a driving frequency of the piezoelectric transformer.

27. The image forming apparatus according to claim 24, wherein the first time constant corresponds to a switching cycle of frequency of the drive signal, and the second time constant is larger than a rising time of the output from the voltage output part.

* * * * *